US011765866B2

(12) United States Patent
Gao (10) Patent No.: US 11,765,866 B2
(45) Date of Patent: Sep. 19, 2023

(54) DATA CENTER INFORMATION TECHNOLOGY CLUSTER DESIGN

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 172 days.

(21) Appl. No.: 17/488,075

(22) Filed: Sep. 28, 2021

(65) Prior Publication Data

US 2023/0100743 A1    Mar. 30, 2023

(51) Int. Cl.
H05K 7/20    (2006.01)

(52) U.S. Cl.
CPC .............. H05K 7/208 (2013.01); H05K 7/203 (2013.01); H05K 7/20318 (2013.01); H05K 7/20327 (2013.01); H05K 7/20381 (2013.01); H05K 7/20836 (2013.01)

(58) Field of Classification Search
CPC ............... H05K 7/20236; H05K 7/203; H05K 7/20772; H05K 7/20809; H05K 7/20781; H05K 7/20272; H05K 7/20318; H05K 7/2079; H05K 7/20381; H05K 5/067; H05K 7/208; H05K 7/20936; H05K 7/2029; H05K 7/20881; G06F 1/20; G06F 2200/201; G06F 1/181; H01L 23/473; H01L 23/44; H01L 23/4735
USPC ................. 65/104.33; 165/80.4, 104.21, 911; 361/699, 700, 701, 679.53, 704, 696, 715, 361/679.46, 719; 257/714, 715, E23.098; 62/259.2, 64, 310, 376, 119; 174/15.1, 174/252, 17 LF, 520, 547
See application file for complete search history.

(56) References Cited

U.S. PATENT DOCUMENTS

| 10,939,581 | B1* | 3/2021 | Chen ................... H05K 7/20781 |
| 11,477,912 | B2* | 10/2022 | Enright .................... B25J 11/00 |
| 2009/0260777 | A1* | 10/2009 | Attlesey ................ H01L 23/473 165/104.33 |
| 2015/0060009 | A1* | 3/2015 | Shelnutt .................. H05K 7/203 165/11.1 |
| 2015/0334880 | A1* | 11/2015 | Best .................... H05K 7/20836 361/679.47 |
| 2017/0295676 | A1* | 10/2017 | Conn .................. H05K 7/20772 |
| 2020/0025451 | A1* | 1/2020 | Stone .................. H05K 7/20781 |
| 2021/0059079 | A1* | 2/2021 | Keehn ................ H05K 7/20327 |

* cited by examiner

Primary Examiner — Mandeep S Buttar
(74) Attorney, Agent, or Firm — WOMBLE BOND DICKINSON (US) LLP (57) ABSTRACT

A data center and a data center cluster have plurality of immersion cooling systems and a plurality of coolant units that provide two-phase coolant to one or more of the plurality of immersion cooling systems. Each coolant unit dispatches and manages two-phase coolant to two or more of the plurality of immersion cooling systems. The coolant units can fill or empty an immersion tank of an immersion cooling system, and can empty or fill a coolant tank in the coolant unit. A single-phase cooling fluid cools the vapor phase of the two-phase coolant in each immersion cooling system. The coolant units are modular, with a common interface to other coolant units and to immersion cooling systems to create a scalable cooling system and data center.

20 Claims, 8 Drawing Sheets

DATA CENTER INFORMATION TECHNOLOGY CLUSTER DESIGN

FIELD OF THE INVENTION

Embodiments of the present invention relate generally to data center cooling. More particularly, embodiments of the invention relate to managing coolant for immersion cooling systems with a multiple cooling loops.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of servers in immersion cooling systems in the data center. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling high performance servers.

One existing solution is immersion cooling. Immersion cooling is an information technology (IT) practice wherein IT components and other electronics, such complete servers, are submerged in a thermally conductive dielectric liquid or coolant ("immersion fluid"). Heat is removed from the IT components by circulating the immersion fluid to directly contact the IT components to be cooled. The immersion fluid can be a two-phase coolant that evaporates in the presence of sufficient heat. Heat is removed from the immersion fluid vapor by a condenser in the vapor portion of an immersion tank that encloses the IT components to be cooled. In such systems of the prior art, the immersion tank, the immersion fluid, the IT components, and the condenser are packaged within an immersion cooling system of IT components. In such systems, the entire immersion cooling system of IT components and in the immersion tanks are filled with immersion coolant. These types of systems are dedicated to only immersion-based systems which are very different for designing, deploying, and managing, especially at scale. The immersion coolant within the immersion cooling system of IT components may significantly increase the complexity of the immersion cooling system of IT components, such that an immersion cooling system that supports immersion cooling may support only immersion coolant IT components and may not be configurable to IT components that utilize other types of cooling systems.

Further, existing data center infrastructure is not well-suited to installation and servicing of immersion cooling systems. When an immersion-cooled server is installed, it may be difficult to add immersion fluid to the server while in the immersion cooling system and there is risk of exposing other IT equipment in the immersion cooling system to the immersion cooling fluid. In addition, existing immersion cooling systems may not be well-suited for removing the immersion fluid so that IT equipment can be serviced, then replacing the immersion fluid to put the IT equipment back into use.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In a first aspect, a data center cluster can include a plurality of immersion cooling systems. Each immersion cooling system can be configured to cool one or more servers submerged in an immersion coolant tank of the immersion cooling system filled with a two-phase coolant. The data center cluster can further include a coolant unit having a coolant tank coupled to a coolant supply. The coolant supply can be interconnected with one or more other coolant units. The coolant tank can be configured to receive coolant from the coolant supply and to automatically balance a coolant level in a coolant tank of each of the one or more other coolant units. The coolant unit coolant tank can be coupled to a coolant fill connection and a coolant drain connection on each of the plurality of immersion cooling systems. The coolant unit can further include a control system having at least one processor coupled to a memory programming with instructions that, when executed, cause the processor to perform operations. The operations can include selecting an immersion cooling system from the plurality of immersion cooling systems, and activating a pump coupled to the coolant tank to fill an immersion coolant tank in the selected immersion cooling system with the coolant. The coolant can be a two-phase coolant. A condenser of the immersion cooling system cools the two-phase coolant in its vapor phase. The condenser can utilize a single-phase cooling liquid to condense the two-phase coolant in its vapor phase. In an embodiment, the plurality of immersion cooling systems can be disposed on opposing sides of the coolant unit. The instructions in the control panel of the coolant unit can further cause the processor to select an immersion cooling system from the plurality of immersion cooling systems, and empty the immersion coolant tank in the selected immersion cooling system. In one embodiment, the coolant unit can fill one immersion coolant tank and empty another immersion coolant tank at the same time. The coolant unit in the data center cluster can also include a control valve coupled between the coolant supply and the coolant tank. The instructions can further cause the processor to activate the control valve to automatically balance the coolant level in the coolant tank in each of the one or more coolant units.

In a second aspect, a data center can include a plurality of immersion cooling systems. Each immersion cooling system can be configured to cool heat-generating information technology (IT) components submerged in an immersion coolant tank of the immersion cooling system filled with a two-phase coolant. The data center can further include a plurality of coolant units. Each coolant unit can be configured to manage the two-phase coolant for one or more of the plurality of immersion cooling systems. Each coolant unit in the plurality of cooling units can include a coolant tank coupled to a two-phase coolant supply. The coolant tank can be coupled to a coolant tank in each of the coolant units in the plurality of coolant units. The coolant tank can be coupled to a coolant fill connection and a coolant drain connection of at least one of the immersion coolant systems. In an embodiment, each coolant unit can be configured to automatically balance a level of the two-phase coolant with at least one other coolant unit in the plurality of coolant units. A coolant unit in the plurality of coolant units can further include a control panel with a processor coupled to a memory programmed with instructions that, when executed by the processor, cause the processor to perform operations. The operations can include selecting an immersion cooling system from the plurality of immersion cooling systems, and filling an immersion coolant tank of the selected immersion cooling system with the two-phase coolant. In an embodiment, each immersion cooling system in the plurality of immersion cooling systems can include a condenser utilizing a single-phase cooling liquid from a facility cooling liquid loop to condense the two-phase coolant in its vapor phase. In an embodiment, each coolant unit in the plurality of coolant units can have a standardized interface configured to couple the two-phase coolant supply and a two-phase coolant return of a coolant loop between coolant unit and each adjacent coolant unit in the plurality of coolant units. The coolant supply can be understood as a fluid communicating loop among the coolant units. The coolant return can be understood as a two phase coolant discharging loop.

The data center can further include a central coolant unit that is the source of the two-phase coolant to each of the plurality of coolant units. The central coolant unit can further include a central coolant pump, and a central coolant control panel having a processor coupled to a memory programmed with executable instructions that, when executed by the processor, cause the processor to fill a coolant tank of a predetermined one of the coolant unit to a predetermined coolant level. The instructions can also cause the processor to perform operations to fill a coolant tank of any or all other coolant units in the plurality of coolant units in the data center, using the first predetermined coolant unit. The executable instructions in the memory of central coolant control panel of the central coolant unit, when executed, further cause the processor to, for each coolant unit in the plurality of coolant units manage a coolant level in the coolant tank of each of the coolant units in the plurality of coolant units via the predetermined one of the coolant units and interconnections between the predetermined one of the coolant units and the remainder of the plurality of coolant units. In an embodiment, the central coolant control system can be coupled to a control panel of each coolant unit via a standardized control interface and a control valve can be coupled to an inlet of the coolant tank can be controlled by the central coolant control system via the control panel. In addition a coolant pump can be coupled to an outlet of the coolant tank and can be controlled by the central coolant control system via the control panel. Further, a control valve coupled to an outlet of the coolant pump can be controllable by the central coolant control system via the control panel. In an embodiment, the plurality of coolant units can be arranged in a row, and a first row of the immersion cooling systems in the plurality of immersion cooling systems can be disposed along one side of the row of coolant units and the remainder of the plurality of immersion cooling systems can be arranged in second row along another side of the row of coolant units. In an embodiment, a first row of immersion cooling systems of the plurality of immersion cooling systems can be arranged along one side of a first row of coolant units in the plurality of coolant units and a second row of immersion cooling systems in the plurality of immersion cooling systems can be arranged in a second row along one side of a second row of coolant units in the plurality of coolant units. In an embodiment, the central coolant unit can be connected to one or more coolant units in the plurality of coolant units which can be in different rows.

In a third aspect, a data center can include a plurality of modular coolant units that manage a two-phase coolant supplied to each immersion cooling system of a plurality of modular immersion cooling systems. In an embodiment, each of the coolant units can be interconnected with an adjacent one of the plurality of modular coolant units. In an embodiment, each coolant unit in the plurality of modular coolant units can have a standardized interface to any of the plurality of immersion cooling systems. In an embodiment, each coolant unit in the plurality of modular coolant units can have a standardized interface to any of the other coolant units in the plurality of coolant units.

Figure 1:
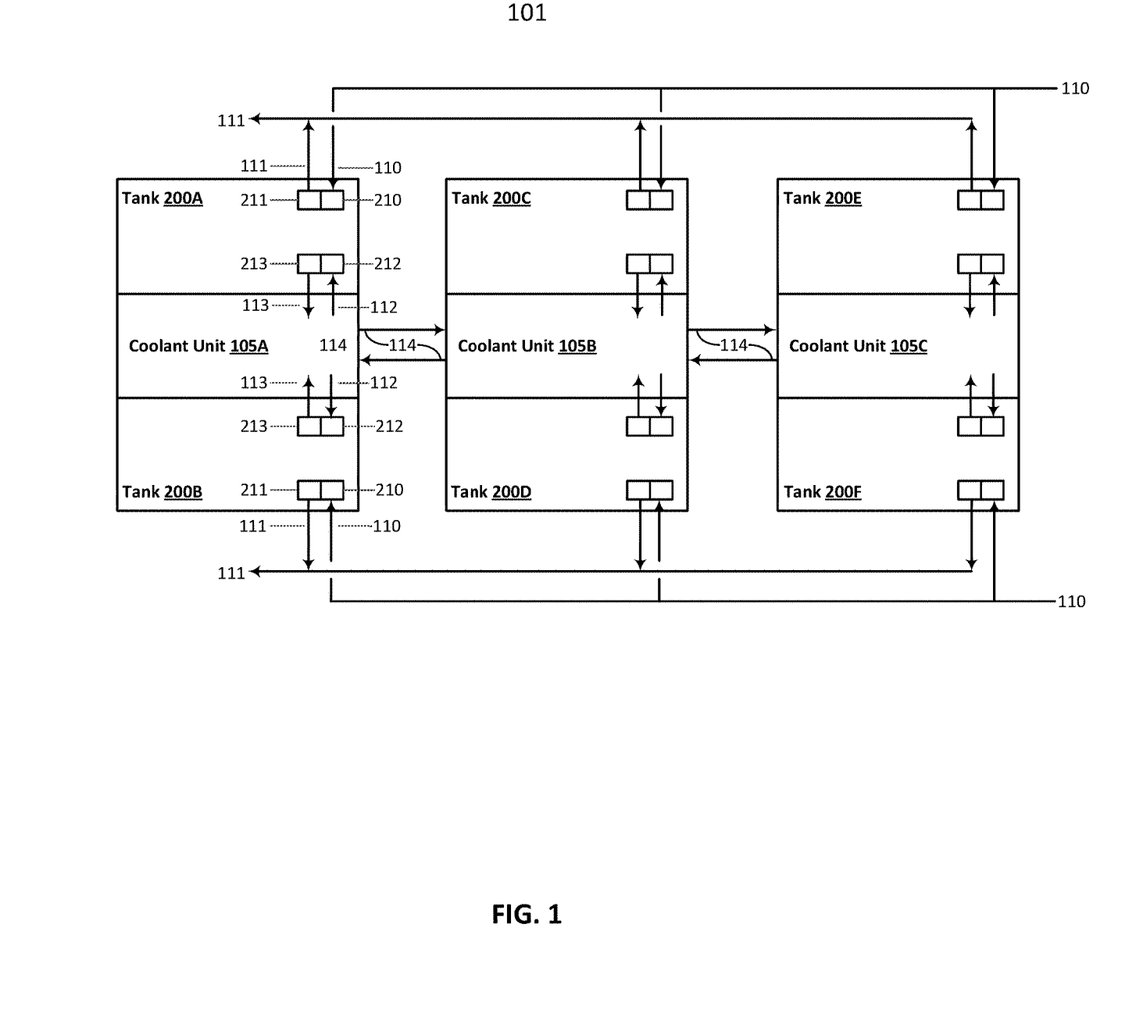
FIG. 1 is a block diagram illustrating an example data center layout design having a coolant unit located between two immersion cooling systems, according to one embodiment.

FIG. 1 is a block diagram illustrating a data center 101 layout design having a one or more coolant units, e.g. 105A-105C (collectively and individually, coolant unit(s) 105) that each serve two immersion cooling systems, e.g. immersion cooling systems 200A and 200B (collectively and individually, immersion cooling systems(s) 200) of information technology (IT) components, according to one embodiment. In this work, the immersion cooling system can be understood as an immersion cooling tank. An immersion cooling tank provides immersion cooling for servers submerged in the two phase coolant inside the immersion tank. Therefore, the immersion cooling system here is the server immersion cooling system. In the following description, these terms are also interchangeable with the term immersion cooling unit. Therefore, in this work, immersion cooling tank, immersion cooling system, and immersion cooling unit should be understood as one term. The key focus of the present disclosure is the development of a two phase coolant management system and architecture for these immersion cooling systems.

Each coolant unit(s) 105 can provide coolant, e.g. a two-phase coolant, to two immersion cooling systems 200. A immersion cooling system 200, e.g. immersion cooling system 200A, positioned on one side of coolant unit 105, e.g. unit 105A, and a second immersion cooling system 200, e.g. immersion cooling system 200B, positioned on the opposite side of cooling unit 105 from the first immersion cooling system. Two-phase coolant supply 112 can be provided to immersion cooling system 200 via two-phase coolant supply connection 212. Two-phase coolant return 113 can be emptied from tank 200 and returned to coolant unit 105 via two-phase coolant return connection 213. Two-phase coolant supply and return connections 212 and 213 for each immersion cooling system 200 can be installed in each immersion cooling system 200 or in the coolant unit 105 that provides the two-phase coolant supply and return 112 and 113, respectively, to the immersion cooling system 200. Coolant units 105 are designed as modular, scalable components in a data center. Operation of coolant units 105 is described in detail, below, with reference to FIG. 8.

Immersion cooling systems or immersion cooling tank (or immersion cooling unit) 200 can include one or more servers (not shown), or other information technology (IT) components, having heat-generating components (not shown) that require cooling. Immersion cooling is described below with reference to FIG. 7. Each immersion cooling system 200 can include a single-phase cooling liquid supply connection 210 that is coupled to a facility single-phase cooling liquid supply 110. Each immersion cooling system 200 can similarly include a single-phase cooling liquid return connection 211 that is coupled to a facility single-phase cooling liquid return 111. Single phase coolant can be circulated continuously through one or more components, such as a condenser (not shown) within the tank 200.

Immersion cooling systems 200 can incorporate a server (not shown) or other IT equipment having heat-generating components cooled by being submerged in the two-phase coolant in a tank of the immersion cooling system. The immersion cooling system incorporates a condenser (not shown) that cools the two-phase coolant when the two-phase coolant is in its vapor phase. The condenser (not shown) cools the two-phase coolant using single-phase cooling liquid furnished by single-phase cooling liquid supply 110 and return 111 via connections 210 and 211, respectively. Immersion cooling is described below with reference to FIG. 7 and FIG. 8.

In FIG. 1, two-phase coolant 114 supply and return lines are coupled between each coolant unit 105A-105C so that each coolant unit 105 can manage and control two-phase coolant to an adjacent coolant unit 105. In this design, the two coolant lines 114, supply and return, do not represent that the coolant recirculates. Instead, these lines represent that the coolant can flow in either direction between the adjacent two coolant units.

Figure 2:
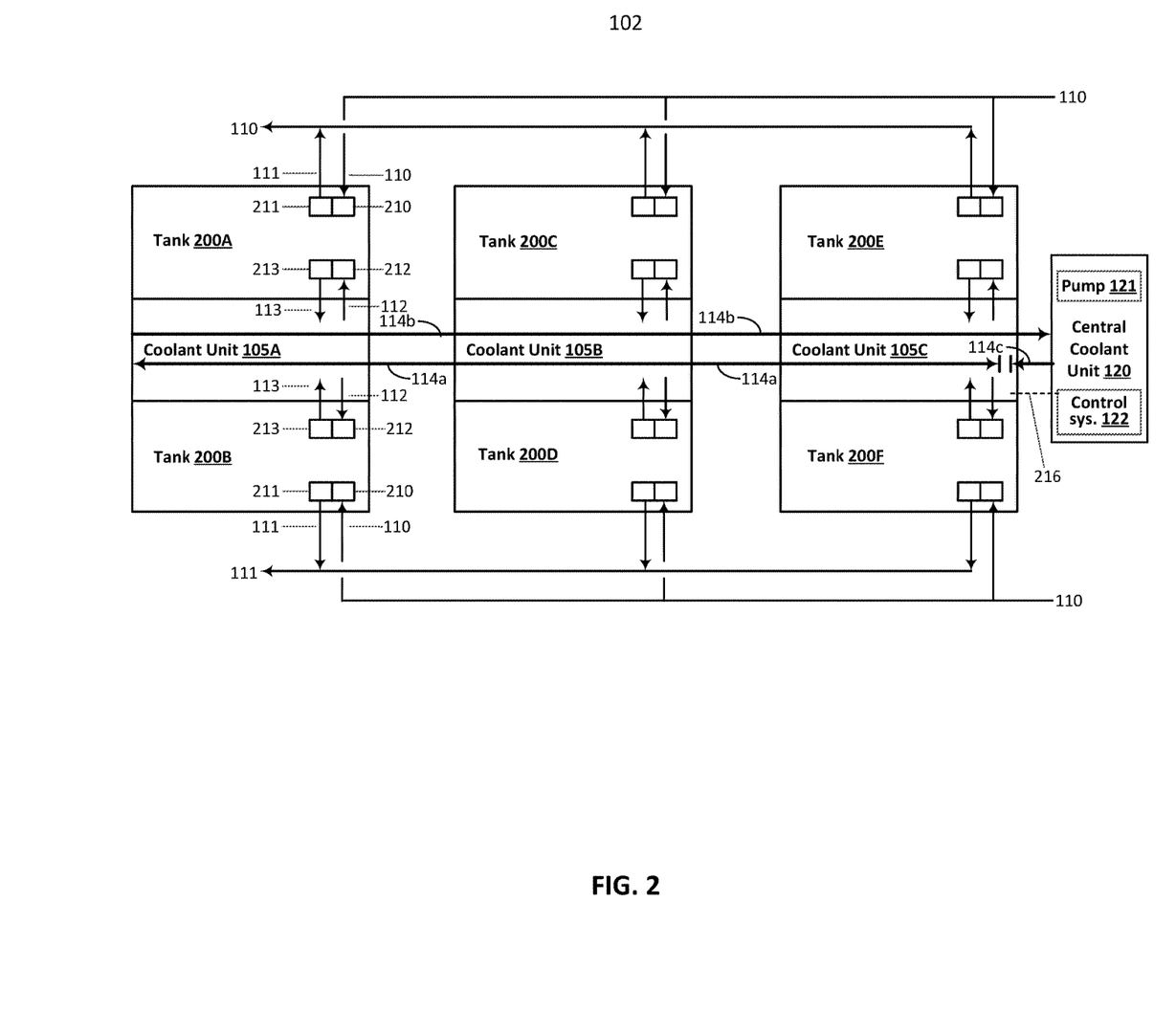
FIG. 2 is a block diagram illustrating an example data center having a two-phase coolant distribution system with one central coolant unit and plurality of sub-coolant units, according to one embodiment.

FIG. 2 is a block diagram illustrating an example data center 102 having a two-phase coolant distribution system with one central coolant unit and plurality of sub-coolant units, according to one embodiment. The data center 102 of FIG. 2 can be substantially identical to the data center 101 of FIG. 1, with the differences that two-phase coolant recirculation loop 114 extends to each cooling unit 105, e.g. 105A-105C, within data center 102 in a single data-center level loop 114 and that data center 102 incorporates a central cooling unit 120. Two-phase coolant supply loop 114 can originate, and return to, central cooling unit 120. Central cooling unit can contain two-phase tanks (not shown) that hold a quantity of two-phase cooling fluid, tank filling connections for a facility-level filling of the two-phase cooling tank, and further include one or more pumps (not shown) provide a central source for distributing two-phase coolant within the data center, such as for use with immersion cooling systems (200). In an embodiment, central coolant unit 120 can include a condenser (not shown) that regulates temperature of the two-phase coolant being supplied 114 within the data center. Central cooling unit 120 can include other valves, instrumentation, control system 122, and coolant pump(s) 121 to supply two-phase cooling fluid to cooling units 105 in data center 102. Control panel 122 can include one or more hardware processors coupled to a memory. The memory can be programmed with instructions that, when executed by the one or more hardware processors cause the processor to actuate the coolant pump 121 and one or more sensors within coolant unit 105 to fill a coolant tank (not shown) within coolant unit 105 to a predetermined level of coolant. Control system 122 can further includes instructions that, when executed, cause the processor to control a coolant to distribute coolant to one or more other coolant units in the data center.

Central coolant unit 120 can be coupled to a single coolant unit, e.g. coolant unit 105C, via communication line 216. Logic with control system 122 of central coolant unit 120 can control filling, level management, and other coolant management functionality via a single coolant unit. For example, central coolant unit 120 control system 122 can cause coolant unit 105C to receive coolant 114 from central coolant unit 120. Coolant units 105A-105C can perform automatic coolant leveling between coolant units 105A, 105B, and 105C. Details on this functionality are described below with reference to FIG. 8. In this design, the coolant lines 114 lines represent that the coolant can flow in either direction. Coolant line 114B represents the coolant discharging loop. This loop is used for discharging the coolant from one coolant unit 105. The lower coolant loop consists of coolant lines 114A and 114C. Coolant line portion 114A represents the automatically balancing coolant loop, and it can be seen that the coolant can flow either direction between each two coolant units. Coolant line portion 114C represents the fluid charging using the loop between the central coolant unit 120 and one of the coolant units, such as 105C.

Figure 3:
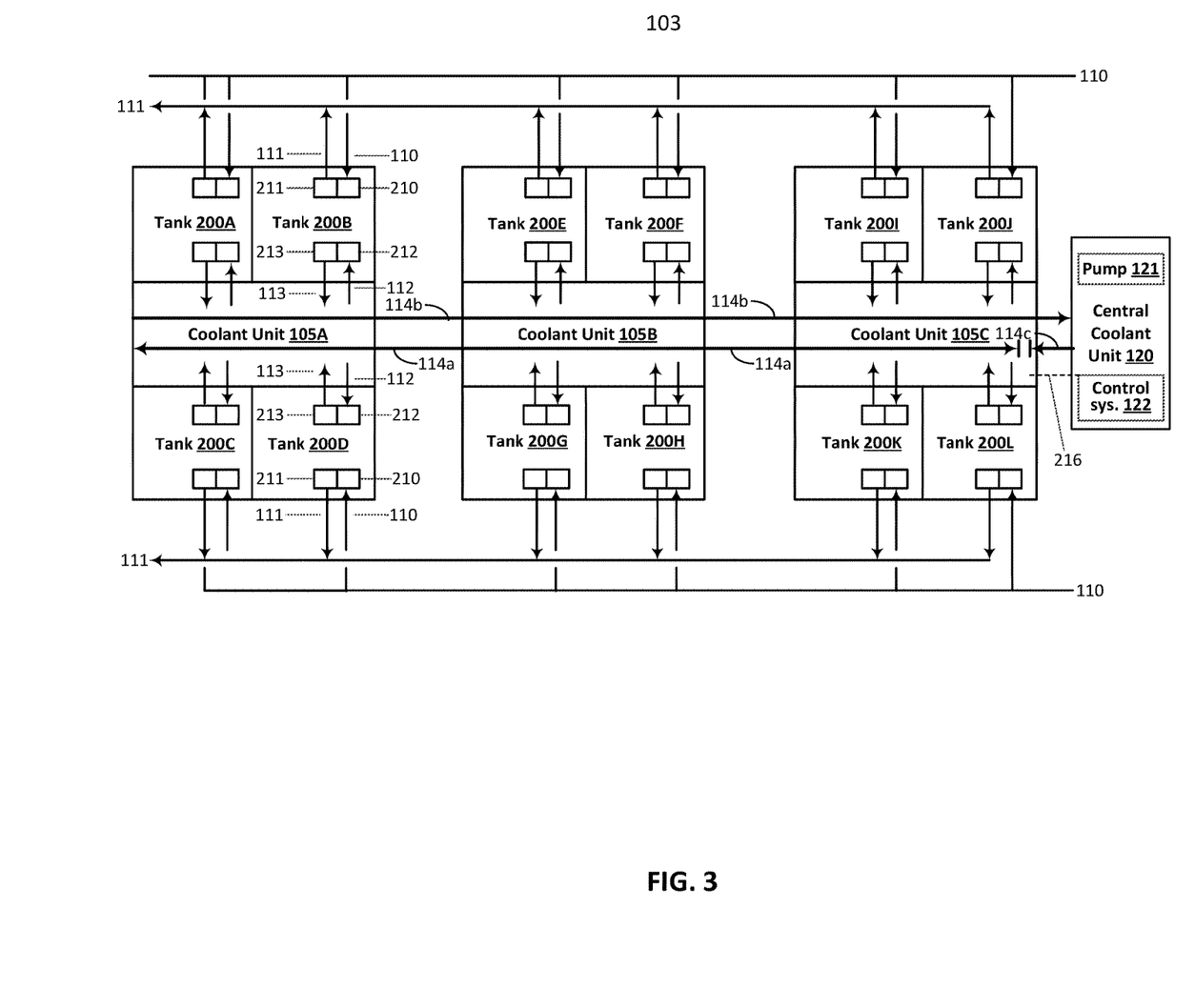
FIG. 3 is a block diagram illustrating an example data center cluster in which individual coolant units are used for multiple immersion cooling systems, or a small cluster of immersion cooling systems, according to one embodiment.

FIG. 3 is a block diagram illustrating an example data center 103 cluster in which individual coolant units are used for multiple immersion cooling systems 200, or a small cluster of immersion cooling systems, according to one embodiment.

Data center 103 can be substantially identical to data center 102, with the difference that each cooling unit 105, e.g. cooling units 105A-105C, can provide two-phase coolant supply 112 and return 113 to a cluster of immersion cooling systems 200 surrounding each cooling unit 105. For example, coolant unit 105A can provide two-phase coolant to immersion cooling systems 200A and 200B on one side of cooling unit 105A and can provide two-phase coolant to immersion cooling systems 200C and 200D on another side of cooling unit 105A. Cooling units 105 can be of a modular, scalable design having standard interfaces as described below with reference to FIG. 8.

Figure 4:
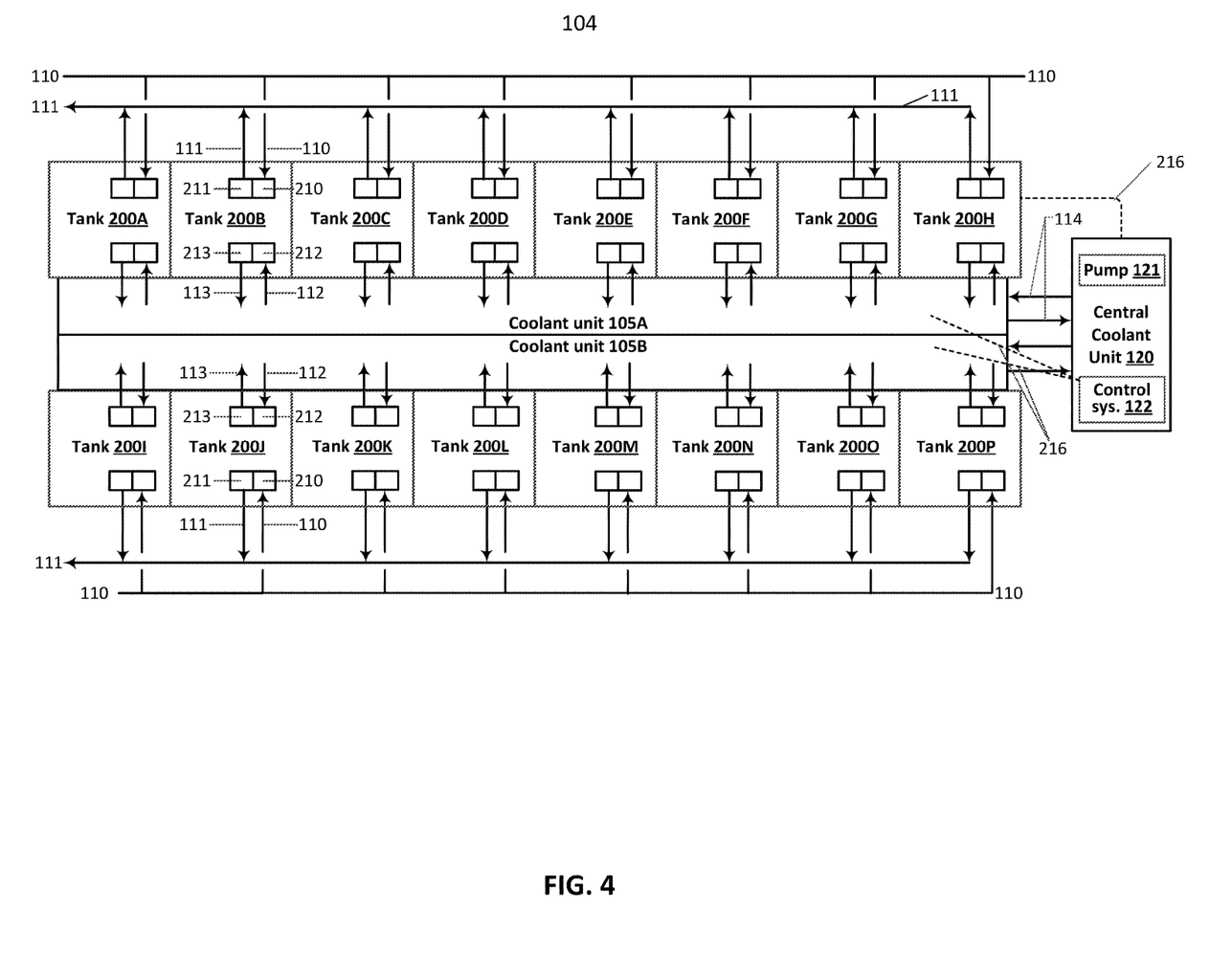
FIG. 4 is a block diagram illustrating an example of a data center design in which two large coolant unites are configured between two rows of immersion cooling systems, according to one embodiment.

FIG. 4 is a block diagram illustrating an example of a data center 104 design in which two large coolant unites are configured between two rows of immersion cooling systems, according to one embodiment. The data center of FIG. 4 can be substantially identical to the data centers 101, 102, and 103 of FIGS. 1, 2, and 3, respectively, with the difference that two modular, scalable cooling units 105, e.g. 105A and 105B, can each be used to provide two-phase coolant to a row of immersion cooling systems 200. In data center 104, each cooling unit 105 can provide two-phase coolant to electronics racks that are all on a single side of the cooling unit 105. Each cooling unit 105 can have a two-phase coolant recirculation loop 114 that originates from the central coolant unit 120. Each row of immersion cooling systems can be configured as a cluster of immersion cooling systems. Embodiments of data center 104 are readily, dynamically scalable.

Central coolant unit 120 can provide control signals 216 to each coolant unit 105A and 105B to command each bank of cooling units (105A, 105B) to automatically fill and automatically level an amount of two-phase coolant 114 stored in each coolant tank (not shown) within each coolant unit 105A and 105B.

Figure 5:
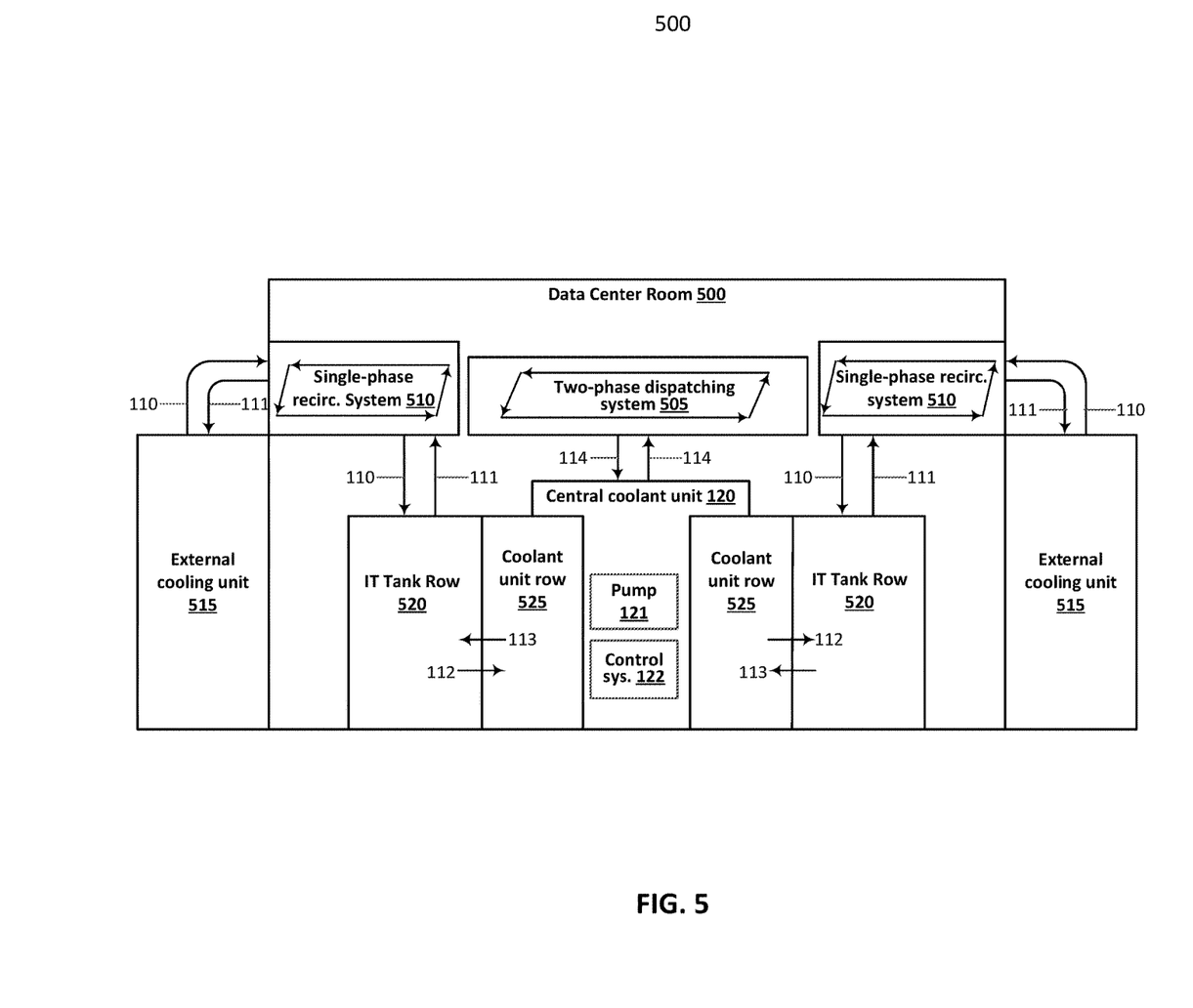
FIG. 5 is a block diagram illustrating an example of a data center having a modular design, according to one embodiment.

FIG. 5 is a block diagram illustrating side view of an example of a data center 500 having a modular, scalable design, according to one embodiment. Data center 500 can be substantially identical to data center 104 of FIG. 4, or easily adapted from any of data centers 101, 102, and 103. Side view of data center 500 illustrates the functional relationship between components and subsystems of the data center 500.

Data center room 500 can include two single-phase cooling liquid recirculation systems 510, such as one on each side of data center room 500. Single-phase cooling liquid recirculation systems can be facility cooling liquid systems that are cooled by an external cooling unit 515, via single-phase cooling liquid supply and return 110 and 111, respectively. Each single-phase cooling liquid system 510 provides single-phase cooling liquid to immersion cooling systems (not shown) within information technology (IT) tank row 520. An IT tank row 520 can be, e.g., the row of immersion cooling systems 200A-200H or 200I-200P in FIG. 4. The immersion cooling systems 200 on each side of a plurality of cooling units 105, as shown in FIGS. 1 through 3 can also be an IT tank row 520. Coolant unit row 525 can be the coolant unit 105A or 105B of FIG. 4, or the plurality of coolant units 105A-105C as shown in FIGS. 1 through 3. Central coolant unit 120 can be the central coolant unit of FIGS. 2 through 4. As indicated by the trapezoids of directed arrows, single-phase cooling liquid system is a recirculating system. Similarly, two-phase coolant dispatching system 505 can be a recirculating system. In an embodiment, central coolant unit 120 can manage dispatching, level distribution, or removal of two-phase coolant to/from coolant units 525 and IT tank rows 520, but the two-phase coolant is continuously recirculated like the single phase cooling liquid. IT tank row can be understood as a row for populating immersion cooling tanks.

Figure 6:
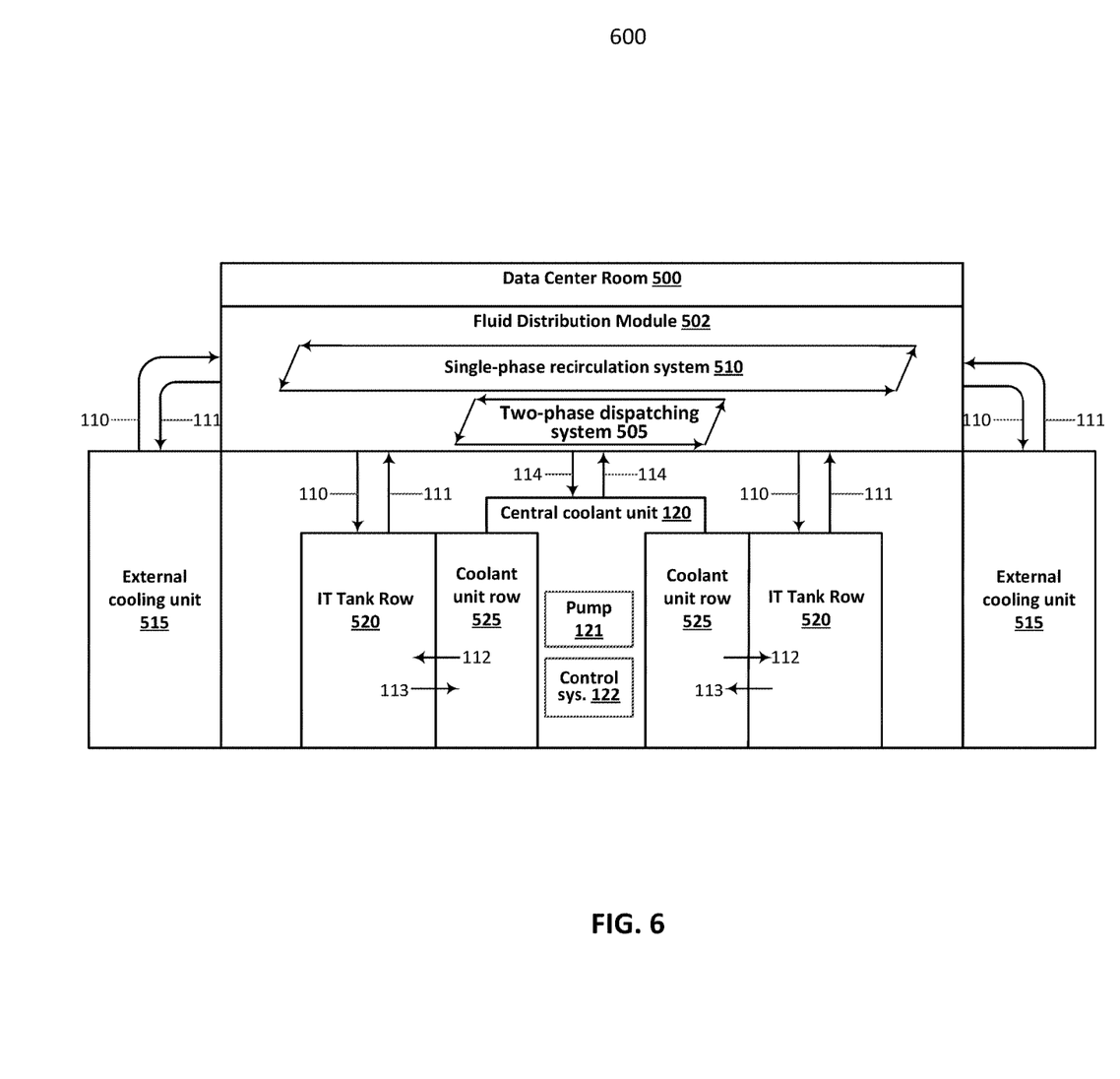
FIG. 6 is a block diagram illustrating an example of a data center having a modular design, according to one embodiment.

FIG. 6 is a block diagram illustrating a side view of an example of a data center having a module design, according to one embodiment. Data center 600 of FIG. 6 can be substantially identical to data center 500 of FIG. 5, with the difference that the single phase cooling liquid recirculation system can be a single integrated recirculation system, rather than two independent single-phase cooling liquid recirculating systems 519. In addition, the single phase loop 510 and two phase loop 505 can be packaged together as one fluid distribution module 502. The coolant loops 114 shown in FIG. 5 and FIG. 6 are only for illustration purpose for modular design, they do not represent the actual locations where they are in the overall system. For example, in FIG. 6, even though 510 and 505 are packaged together as one module 502, the single phase recirculation system 510 maybe located over the top of the IT tank row 520, and the two-phase dispatching system 505 can be located at lower locations of the coolant unit row 525.

Figure 7:
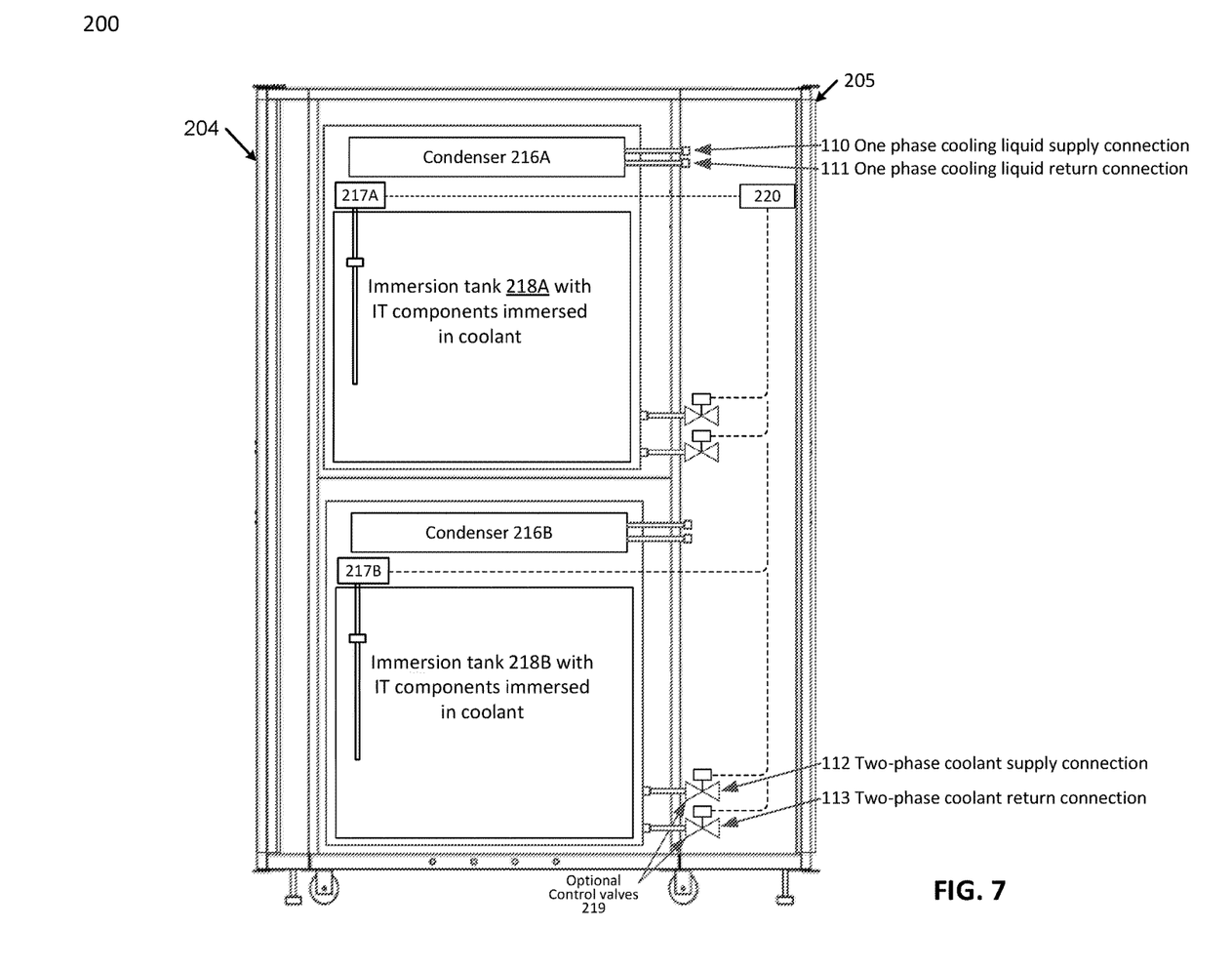
FIG. 7 is a block diagram illustrating an example of a side view of an immersion cooling system, according to one embodiment.

FIG. 7 is a block diagram illustrating an example of a side view immersion cooling system 200, according to one embodiment. Although immersion cooling system 200 is shown with two immersion tank systems in a rack configuration, this need not be the case. In a typically embodiment, a single immersion system, can include an immersion tank 218, a condenser 216, and other related controls shown in FIG. 7. Immersion cooling system 200 may represent any of the immersion cooling systems 200 as shown in FIGS. 1 through 5, such as, for example, immersion cooling systems 200A-200F of FIGS. 1 and 2, immersion cooling systems 200A-200L of FIG. 3, and immersion cooling systems 200A-200P in FIG. 4. In an embodiment, an immersion cooling system can include only one immersion tank.

Each server (not shown) submerged in immersion tank 218 may include one or more information technology (IT) components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server (not shown) may include a host server (referred to as a host node) coupled to one or more compute servers (also referred to as computing nodes, such as CPU server and GPU server).

A host server 203 (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The computer servers perform the actual tasks, which may generate heat during the operations.

In the immersion cooling system 200, the heat-generating IT components (not shown) are cooled by thermal transfer to the two-phase coolant by direct contact with the IT components. In the presence of sufficient heat, the two-phase coolant changes to a vapor phase. The vapor rises in the liquid into a vapor space within the tank 218. A condenser, e.g. condenser 216A or 216B (generically, 216), is installed in the vapor space within the above the two-phase coolant in the vapor space. The condenser 216 can be tube-to-fin heat exchange that receives heat from the two-phase coolant vapor via, e.g., fins and circulates single-phase or two-phase cooling fluid within a tube through the fins. The two-phase coolant vapor is cooled back into a liquid state and returns to the immersion fluid tank 218. The condenser 216 can receive and return single-phase cooling fluid from connections 220 to single-phase coolant supply and return connections 210 and 211, respectively.

Immersion tank 218 can receive an initial supply two-phase coolant 112 via two-phase coolant supply connection 212. In an embodiment, two-phase coolant supply and return connections 212 and 213, respectively, can be coupled to respective two-phase coolant supply and return connections on coolant unit 105 (not shown). During an immersion coolant tank 218 fill operation, two-phase coolant supply 212 can fill the immersion tank with 218 under control of a pump (not shown) and limited by a level switch 217. The level switch 217 can provide a level signal to that is interfaced 220 to a coolant unit (not shown). In response to the level switch 217 indicating that immersion tank 218 is full of two-phase coolant 212, the coolant unit (not shown) can signal the pump to turn off. Similarly, the coolant unit (not shown) can control the pump and associated valves (not shown) to have the coolant unit 105 drain the immersion tank 218 of two-phase coolant 112, e.g., so that the two-phase coolant (immersion fluid) can be changed, or the server 203 be taken out of service. Under the control of the coolant unit (not shown). In an embodiment, coolant unit (not shown) can include a user interface allowing a technician to select a particular server 203, and (as applicable) present an interface to command the coolant unit (not shown) to fill or empty the coolant tank 218. Immersion-cooled server 203D can be coupled to two-phase coolant supply connection 212 and return connection 213 with connections 220 and 221, and can also include a control value 219. The control valves 219 can be controlled by logic in the coolant unit to, e.g., open the two-phase coolant supply valve 219 when the coolant unit instructs a coolant unit (not shown) to fill coolant tank 218 with two-phase coolant, such as during initial commissioning of the server 203D. The coolant unit can also control two-phase coolant return valve 219 to open when the coolant unit (not shown) is instructed to empty the coolant tank 218, such as when taking a server in the immersion tank out of service for maintenance, repair, or decommissioning. Immersion system 200 can include a pump (not shown) that is also controlled by coolant unit (not shown) to assist in draining coolant tank 218.

The immersion cooling system configuration as shown in FIG. 7 is shown and described for the purpose of illustration only; other configurations or arrangements may also be applicable.

Figure 8:
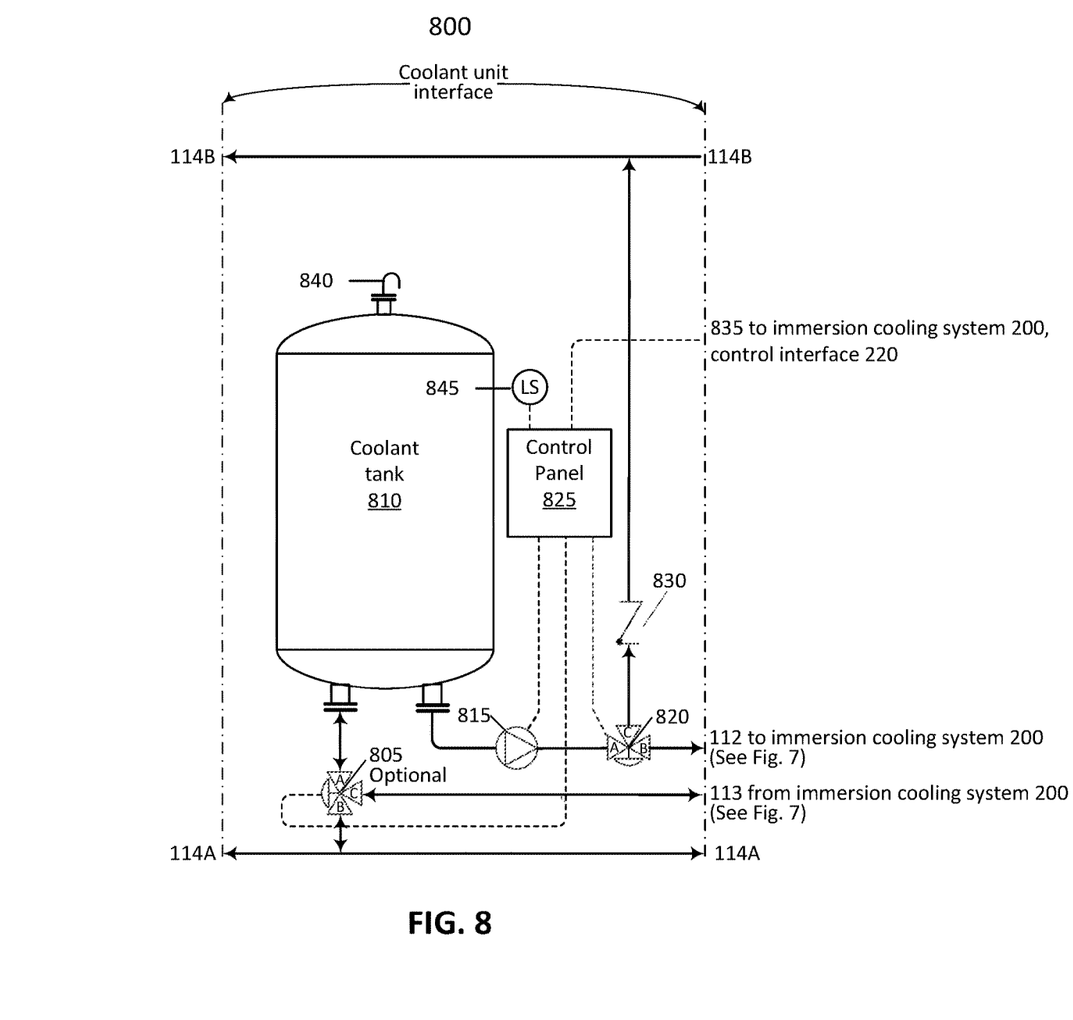
FIG. 8 is a block diagram illustrating an example coolant unit configuration and associated controls and interfaces, according to one embodiment.

FIG. 8 is a block diagram illustrating an example coolant unit 800 configuration and associated controls and interfaces, according to one embodiment. Coolant unit 800 can be the coolant unit 105 of FIGS. 1 through 4, with configuration differences as described above in FIGS. 1 through 4. Coolant unit 800 is a modular design with a defined interface to facility systems and immersion cooling systems.

Coolant unit 800 can be coupled to a central coolant supply loop 114A that, in an embodiment, dispatches two-phase coolant throughout a data center, such as data centers 101 through 104, 500, and 600 as described above in FIGS. 1 through 6. Coolant unit can include a coolant control valve 805, a coolant tank 810, a coolant pump 815, a coolant control valve 820, a control panel 825, a check valve 830, a coolant tank vent 840, and a level switch or sensor 845. In an embodiment, control valves 805 and 820 can be 3-way control valves whose configuration state is controlled by control panel 825. A signal line 835 can be routed from the control panel 825 to immersion cooling system 200 so that immersion cooling system 200 at least some operating modes of coolant unit 800. Coolant line 114A represents the coolant auto-balancing line and coolant line 114B represents the coolant discharging line.

Coolant unit 800 can store two-phase coolant that is used by immersion-cooled servers (not shown) in immersion cooling systems (not shown). During normal operation of an immersion cooling system 200, coolant unit 800 is usually in an inactive state. Coolant unit 800 can perform at least the following functionality in the following modes. In Table I, below, 3-way control valve ports A, B, and C can be O=OPEN, X=CLOSED, or N/C="no care" or "no connect."

TABLE I

| Mode | Control Valve 805 Ports | | | Pump | Control Valve 820 Ports | | |
|---|---|---|---|---|---|---|---|
| | A | B | C | | A | B | C |
| Auto-level all coolant tanks | O | O | X | OFF | X | X | N/C |
| Empty one coolant tank | X | X | N/C | ON | O | X | O |
| Fill immersion tank | N/C | N/C | N/C | ON | O | O | X |
| Empty immersion tank | O | X | O | OFF | X | X | N/C |

Auto-level/fill coolant tanks mode: Auto-level/fill mode is typically used during initial set-up of a data center facility wherein coolant units and immersion cooling systems have been installed in the facility, but the coolant units 105/800 have not yet been filled with two-phase coolant. In coolant tank fill mode, two-phase coolant is added to tank 810 from two-phase coolant supply loop 114A via control valve 805. In an embodiment, control valve 805 can be omitted from each coolant tank 810 in a each coolant unit 105/800 so that when any coolant unit tank 810 receives two-phase fluid, all coolant units 105/800 that are coupled together via the coolant supply 114A will automatically achieve the same level by fluid dynamics and gravity. In an embodiment, instead of a control valve 805, a manual valve can be used. Using auto-level/fill mode, the control valve 805 can be set by control panel 825 so that ports A and B of the 3-way control valve 805 are open and port C is closed. This allows coolant supply 114A to enter coolant tank 810. Pump 815 can be OFF, and control valve 820 can have ports A and B closed while port C of control valve 820 is "N/C " (no connect or not care). Two-phase coolant can be added to coolant tank 810 until a predetermined fill state of the coolant tank 810 is met. The predetermined fill state can be sensed by level switch 845, by a predetermined fill duration, a cumulative flow amount detected by a flow rate sensor (not shown), or other technique.

Empty one coolant tank: In empty one coolant tank 810 mode, the coolant tank 810 or other part of the cooling unit 105/800 may need to be serviced, and thus the coolant tank 801 may need to be emptied. In this mode, control valve 805 ports A and B can be closed so that coolant supply 114A is not permitted to fill the coolant tank 810 while the coolant tank is being emptied. Port C of control valve 805 is N/C. Control panel 825 can cause control valve 820 to have ports A and C open and port B closed, so that when pump 815 is turned ON, coolant will be pumped out of coolant tank 810 through ports A and C of control valve 820, out through check valve 830, and up to coolant loop 114B. In some embodiments, there can be a separate coolant loop 115 (not shown) that returns coolant that is removed from the coolant tank 810 and returns the coolant back to the central coolant unit 120.

Immersion tank fill mode: In immersion tank fill mode, two-phase coolant can be pumped by pump 815, through control valve 820, which is configured with ports A and B open and port C closed, into immersion cooling tank (not shown). Immersion tank fill mode can be configured in at least two ways: First, immersion tank (not shown) can be filled from coolant tank 810. In this configuration, control valve 805 is configured with port A and C open and port B closed. Second, immersion tank (not shown) could be filled from coolant supply 114A by configuring control valve 805 with ports B and C open, and port A closed.

Immersion tank empty mode: In immersion tank drain mode, coolant is removed from an immersion tank (not shown) so that the immersion tank (not shown) can be serviced. In this mode, coolant can be removed from immersion tank (not shown) by a pump (not shown) on the immersion tank (not shown) such coolant removed from the immersion tank is pumped back to the coolant tank 810. Control panel 825 can configure control valve 805 with ports A and C open and port B closed. This configuration allows coolant return 113 from immersion tank (not shown) to returned to coolant tank 810.

In the foregoing specification, embodiments of the invention have been described with reference to specific exemplary embodiments thereof. While rack orientations are shown as horizontal, this is not limiting. Different server rack orientations, e.g. vertical, or upward/downward, can be implemented using this disclosure. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center cluster, comprising:
a plurality of immersion cooling systems, each immersion cooling system configured to cool one or more servers submerged in an immersion coolant tank of the immersion cooling system, filled with a two-phase coolant; and
a coolant unit having:
a coolant tank coupled to a coolant supply that is interconnected with one or more other coolant units, wherein the coolant tank is configured to receive coolant from the coolant supply and to automatically balance a coolant level in a coolant tank of each of the one or more other coolant units; and
the coolant tank is coupled to a coolant fill connection and a coolant drain connection on each of the plurality of immersion cooling systems.

2. The data center cluster of claim 1, wherein the coolant unit further comprises a control system having at least one processor coupled to a memory programming with instructions that, when executed, cause the processor to perform operations to:
select an immersion cooling system from the plurality of immersion cooling systems, and
activate a pump coupled to the coolant tank of the coolant unit to fill an immersion coolant tank in the selected immersion cooling system with the coolant.

3. The data center cluster of claim 1, wherein a condenser of the immersion cooling system cools the two-phase coolant in its vapor phase, wherein the condenser utilizes a cooling liquid to condense the two-phase coolant in its vapor phase.

4. The data center cluster of claim 1, wherein the plurality of immersion cooling systems are disposed on opposing sides of the coolant unit.

5. The data center of cluster of claim 1, wherein the coolant unit further comprises a control system having at least one processor coupled to a memory programming with instructions that, when executed, cause the processor to perform operations to:
select an immersion cooling system from the plurality of immersion cooling systems, and
empty the immersion coolant tank in the selected immersion cooling system.

6. The data center cluster of claim 1, further comprising:
a control valve coupled between the coolant supply and the coolant tank, and the instructions further cause the processor to:
activate the control valve to automatically balance the coolant level in the coolant tank in each of the one or more coolant units.

7. A data center comprising:
a plurality of immersion cooling systems, each immersion cooling system configured to cool heat-generating information technology (IT) components submerged in an immersion coolant tank of the immersion cooling system filled with a two-phase coolant;
a plurality of coolant units, each coolant unit configured to manage the two-phase coolant for one or more of the plurality of immersion cooling systems,
wherein each coolant unit in the plurality of cooling units includes:
a coolant tank coupled to a two-phase coolant supply and the coolant tank is coupled to a coolant tank in each of the coolant units in the plurality of coolant units and the coolant tank is coupled to a coolant fill connection and a coolant drain connection of at least one of the immersion coolant systems; and
once coupled to the loop, each coolant unit is configured to automatically balance a level of the two-phase coolant with the coolant unit at least one other coolant unit in the plurality of coolant units coupled to the loop.

8. The data center of claim 7, wherein coolant unit in the plurality of coolant units further includes:
a control panel with a processor coupled to a memory programmed with instructions that, when executed by the processor, cause the processor to perform operations to:
select an immersion cooling system from the plurality of immersion cooling systems, and
fill an immersion coolant tank of the selected immersion cooling system with the two-phase coolant.

9. The data center of claim 7, wherein each immersion cooling system in the plurality of immersion cooling systems includes a condenser utilizing a single-phase cooling liquid from a facility cooling liquid loop to condense the two-phase coolant in its vapor phase.

10. The data center of claim 7, wherein the instructions further cause the processor to:
fill the coolant tank of the coolant unit from the two-phase coolant supply.

11. The data center of claim 7, wherein each coolant unit in the plurality of coolant units has a standardized interface configured to couple the two-phase coolant supply and a two-phase coolant return of a coolant loop between the coolant unit and each adjacent coolant unit in the plurality of coolant units.

12. The data center of claim 7, further comprising:
a central coolant unit that is the source of the two-phase coolant to each of the plurality of coolant units, and the central coolant unit further includes:
a central coolant pump, and
a central coolant control panel having a processor coupled to a memory programmed with executable instructions that, when executed by the processor, cause the processor to, for each of the plurality of coolant units:

fill a coolant tank of a predetermined one of the coolant unit to a predetermined coolant level.

13. The data center of claim 12, wherein the executable instructions in the central coolant control panel of the central coolant unit, when executed, further cause the processor to, for each coolant unit in the plurality of coolant units:

manage a coolant level in the coolant tank of each of the coolant units in the plurality of coolant units via the predetermined one of the coolant units and interconnections between the predetermined one of the coolant units and the remainder of the plurality of coolant units.

14. The data center of claim 12, wherein the central coolant control system is coupled to a control panel of each coolant unit via a standardized control interface, and:

a control valve coupled to an inlet of the coolant tank is controllable by the central coolant control system via the control panel;

a coolant pump coupled to an outlet of the coolant tank is controllable by the central coolant control system via the control panel; and a control valve coupled to an outlet of the coolant pump is controllable by the central coolant control system via the control panel.

15. The data center of claim 7, wherein the plurality of coolant units are arranged in a row, and a first row of the immersion cooling systems in the plurality of immersion cooling systems are disposed along one side of the row of coolant units and the remainder of the plurality of immersion cooling systems are arranged in second row along another side of the row of coolant units.

16. The data center of claim 14, wherein a first row of immersion cooling systems of the plurality of immersion cooling systems is arranged along one side of a first row of coolant units in the plurality of coolant units and a second row of immersion cooling systems in the plurality of immersion cooling systems is arranged in a second row along one side of a second row of coolant units in the plurality of coolant units.

17. The data center of claim 16, wherein the central coolant unit is connected to one or more coolant units in the plurality of coolant units which are in different rows.

18. A data center, comprising:

a plurality of modular immersion cooling systems, each having at least one immersion cooling system; and a plurality of modular coolant units that manage a two-phase coolant supplied to each immersion cooling system of the plurality of modular immersion cooling systems, wherein each of the coolant units is interconnected with an adjacent one of the plurality of modular coolant units.

19. The data center of claim 18, wherein each coolant unit in the plurality of modular coolant units has a standardized interface to any of the plurality of immersion cooling systems.

20. The data center of claim 18, wherein each coolant unit in the plurality of modular coolant units has a standardized interface to any of the other coolant units in the plurality of coolant units.

* * * * *